United States Patent [19]
Li et al.

[11] Patent Number: 5,772,771
[45] Date of Patent: Jun. 30, 1998

[54] DEPOSITION CHAMBER FOR IMPROVED DEPOSITION THICKNESS UNIFORMITY

[75] Inventors: Shijian Li, San Jose; Fred C. Redeker, Fremont; Tetsuya Ishikawa, Santa Clara, all of Calif.

[73] Assignee: Applied Materials, Inc., Santa Clara, Calif.

[21] Appl. No.: 571,618

[22] Filed: Dec. 13, 1995

[51] Int. Cl.$^6$ .................................................. C23C 16/00
[52] U.S. Cl. ................. 118/723 I; 118/715; 204/298.07
[58] Field of Search ................. 118/715, 723 I, 118/723 IR, 723 E; 204/298.07; 315/111.51; 156/345

[56] References Cited

U.S. PATENT DOCUMENTS

| | | | |
|---|---|---|---|
| 3,717,439 | 2/1973 | Sakai | 118/715 |
| 4,716,852 | 1/1988 | Tsujii et al. | 118/720 |
| 4,817,558 | 4/1989 | Itoh | 118/725 |
| 5,069,930 | 12/1991 | Hussla et al. | 427/55 |
| 5,105,761 | 4/1992 | Charlet et al. | 118/723 ME |
| 5,192,370 | 3/1993 | Oda et al. | 118/723 R |
| 5,250,092 | 10/1993 | Nakano | 96/136 |
| 5,346,578 | 9/1994 | Benzing et al. | 156/345 |
| 5,368,646 | 11/1994 | Yasuda et al. | 118/723 R |
| 5,522,934 | 6/1996 | Suzuki et al. | 118/723 AN |
| 5,525,159 | 6/1996 | Hama et al. | 118/723 I |
| 5,532,190 | 7/1996 | Goodyear et al. | 437/225 |
| 5,554,226 | 9/1996 | Okase et al. | 118/724 |
| 5,614,055 | 3/1997 | Fairbairn et al. | 156/345 |
| 5,620,523 | 4/1997 | Maeda et al. | 118/723 IR |

FOREIGN PATENT DOCUMENTS

| | | |
|---|---|---|
| 0 308 946 A2 | 3/1989 | European Pat. Off. . |
| 61-263118 | 11/1986 | Japan . |
| 197803 | 3/1978 | U.S.S.R. . |

OTHER PUBLICATIONS

Kaplan et al, Deposition Method for Aluminum Oxide Films,IBM Technical Disclosure Bulletin vol. 7 No. 5, pp. 414–415, Oct. 1964.

*Primary Examiner*—R. Bruce Breneman
*Assistant Examiner*—Jeffrie R. Lund
*Attorney, Agent, or Firm*—Townsend and Townsend and Crew LLP

[57] ABSTRACT

An improved deposition chamber (2) includes a housing (4) defining a vacuum chamber (18) which houses a substrate support (14). A set of first nozzles (34) have orifices (38) opening into the vacuum chamber in a circumferential pattern spaced apart from and generally overlying the periphery (40) of the substrate support. One or more seconds nozzle (56, 56a), positioned centrally above the substrate support, inject process gases into the vacuum chamber to improve deposition thickness uniformity. Deposition thickness uniformity is also improved by ensuring that the process gases are supplied to the first nozzles at the same pressure. If needed, enhanced cleaning of the nozzles can be achieved by slowly drawing a cleaning gas from within the vacuum chamber in a reverse flow direction through the nozzles using a vacuum pump (84).

14 Claims, 3 Drawing Sheets

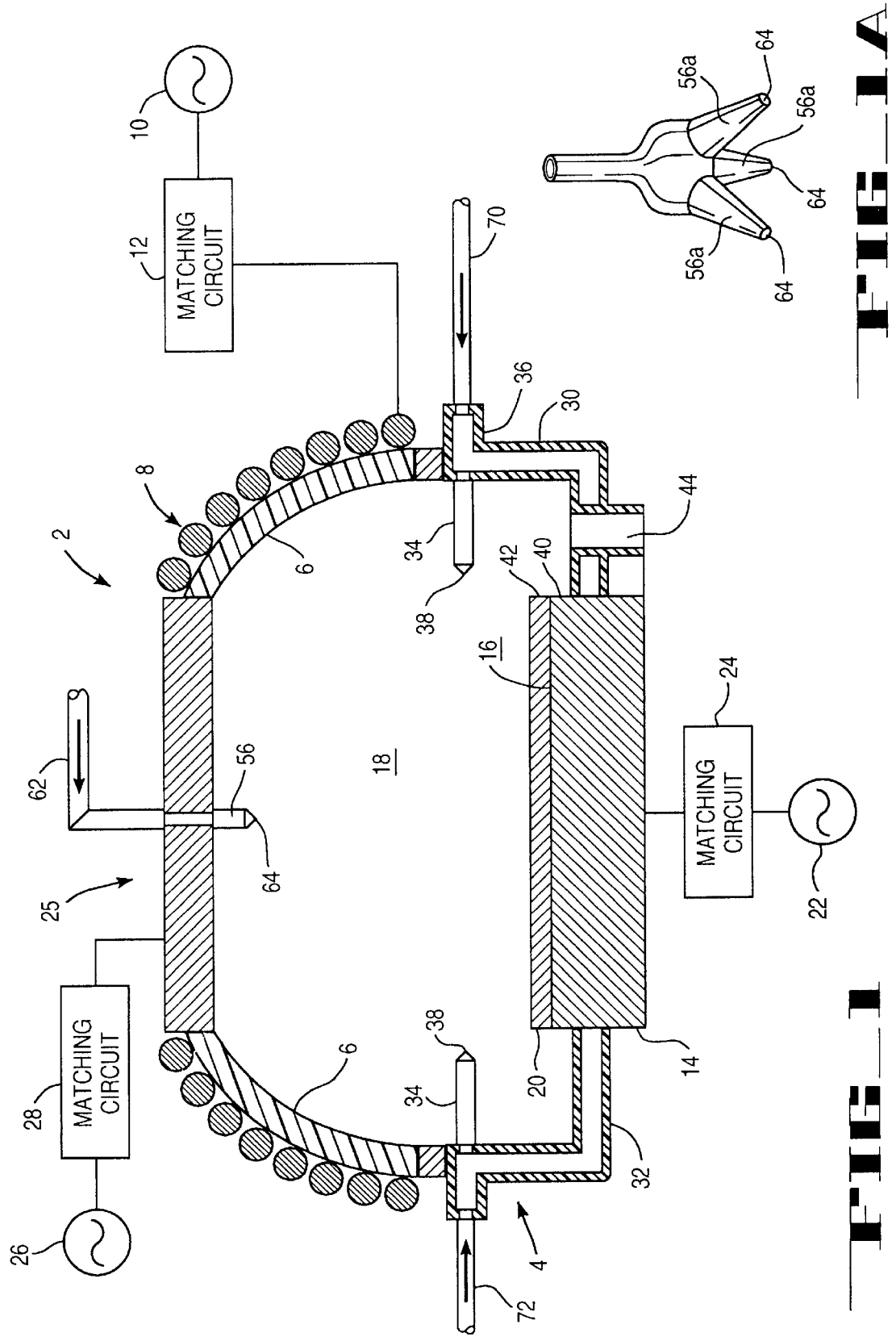

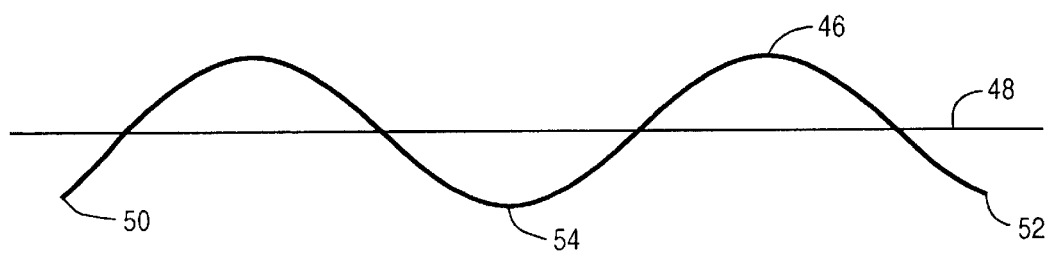
FIG_2 (PRIOR ART)
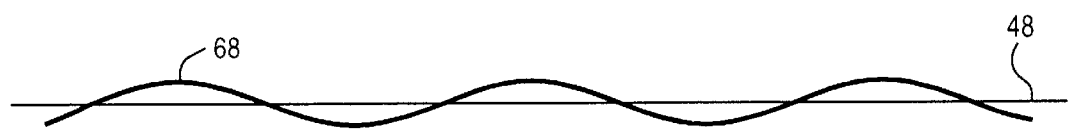
FIG_3

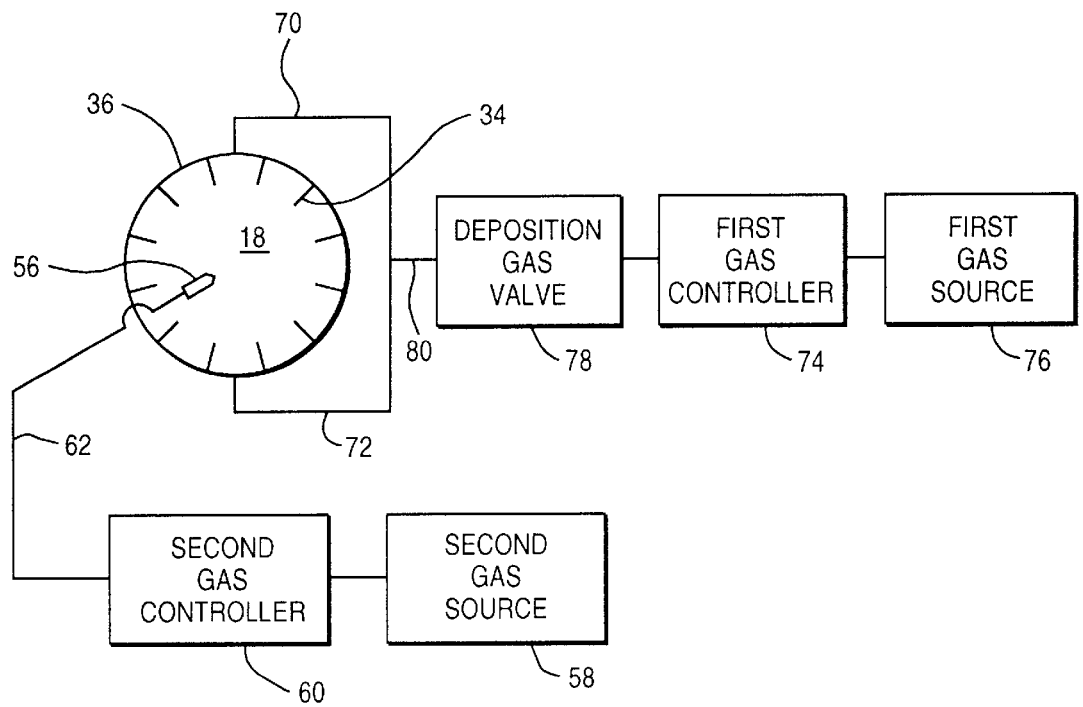
FIG_4
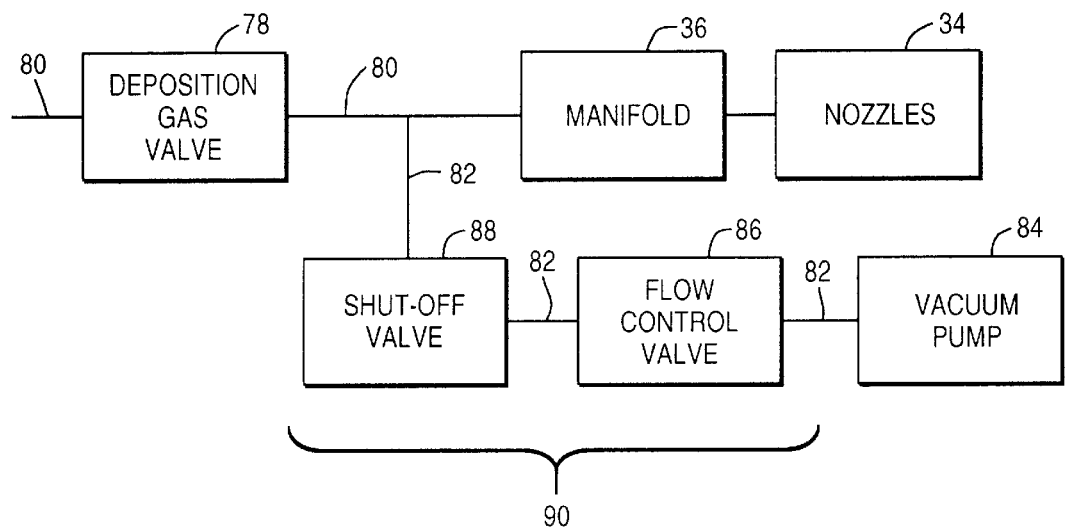
FIG_5

DEPOSITION CHAMBER FOR IMPROVED DEPOSITION THICKNESS UNIFORMITY

BACKGROUND OF THE INVENTION

One of the primary steps in the fabrication of modern semiconductor devices is the formation of a thin film on a semiconductor substrate by chemical reaction of gases. Such a deposition process is referred to as chemical vapor deposition (CVD). Conventional thermal CVD processes supply reactive gases to the substrate surface where heat-induced chemical reactions can take place to produce the desired film. High density plasma CVD processes promote the disassociation of the reactant gases by the application of radio frequency (RF) energy to the reaction zone proximate the substrate surface thereby creating a plasma of highly reactive ionic species. The high reactivity of the released ionic species reduces the energy required for a chemical reaction to take place, and thus lowers the required temperature for such CVD processes.

In one design of high density plasma chemical vapor deposition (HDP-CVD) chambers, the vacuum chamber is generally defined by a planar substrate support, acting as a cathode, along the bottom, a planar anode along the top, a relatively short sidewall extending upwardly from the bottom, and a dielectric dome connecting the sidewall with the top. Inductive coils are mounted about the dome and are connected to a supply radio frequency generator. The anode and the cathode are typically coupled to bias radio frequency generators. A series of equally spaced gas distributors, typically nozzles, are mounted to the sidewall and extend into the region above the edge of the substrate support surface. The gas nozzles are all coupled to a common manifold which provides the gas nozzles with process gases, including gases such as argon, oxygen, silane, TEOS (tetraethoxysilane), silicon tetrafluoride ($SiF_4$), etc., the composition of the gases depending primarily on what type of material is to be formed on the substrate. The nozzle tips have exits, typically orifices, positioned in a circumferential pattern spaced apart above the circumferential periphery of the substrate support and through which the process gases flow.

The thickness of the deposited film is ideally, but in practice is never, perfectly uniform. Deposition uniformity is very sensitive to source configuration, gas flow changes, source radio frequency generator current, bias radio frequency generator currents, the nozzle height above the substrate support and the lateral position of the nozzle relative to the substrate support. Improvements in this deposition uniformity are hindered by several factors. For example, it is often preferable that the height of the nozzles above the substrate support surface be greater than it is. However, for practical reasons it is not feasible to position the nozzles through the dielectric dome. Also, adjusting the height of the nozzles above the substrate for each process condition is not practical unless the substrate is movable vertically. Furthermore, while increasing the distance between nozzle orifices and the substrate tends to improve the deposition uniformity, it adversely affects the gas efficiency, that is requires the use of more gas or more time. In addition, argon is commonly directed through the manifold and nozzles as part of the process gases, argon flow contributing to the effectiveness of sputtering rate and sputtering uniformity. However, the use of argon restricts the flexibility one has in varying the flow rate of the process gases through the nozzles.

Another factor affecting deposition is related to the cleanliness of the nozzle orifices. Some process gases, such as silane, can thermally disassociate and deposit silica on the inside of the nozzle orifices. In addition, some oxygen may diffuse back into the nozzle orifices and react with the process gases to create a deposit on the inside of the nozzle orifices. Attempts to "dry clean" the chamber (by keeping the chamber closed and injecting a cleaning gas, such as fluorine compounds, into the chamber) can create additional problems. For example, fluorine gas can partially react with deposited silica and create a porous material which expands and clogs up the orifices even worse.

SUMMARY OF THE INVENTION

The present invention is directed to an improved deposition chamber which uses a supplemental or second gas distributor, typically a nozzle, centered above the substrate support surface to enhance deposition thickness uniformity. Deposition thickness uniformity is also enhanced by equalizing the pressure of the process gases supplied to a series of gas distributors, also typically nozzles, fed by a common manifold.

The improved deposition chamber includes a housing defining a vacuum chamber. A substrate support is housed within the vacuum chamber. A plurality, typically 12, of first gas distributors, typically nozzles, have their orifices or other exits opening into the vacuum chamber in a circumferential pattern spaced apart from and generally overlying the circumferential periphery of the substrate support surface, as is conventional. With the invention, a second gas distributor is used and is positioned spaced apart from and generally overlying the center of the substrate support surface. The use of the second gas distributor to inject process gases into the vacuum chamber helps to improve deposition thickness uniformity over that which is achieved without the use of the second gas distributor.

Deposition thickness uniformity is also improved by supplying the process gases to the manifold at a plurality of positions. The supply of the process gases to the manifold is done in a manner so that the process gases are supplied to the gas distributors at the same pressure. This is done to ensure an equal flow rate from each of the first gas distributors.

The exits of the gas distributors are preferably sized to permit effective dry cleaning operations. In some situations dry cleaning operations may not be effective to clean the inside surfaces of the exits. In such situations enhanced cleaning of the gas distributors can be achieved by selectively connecting a vacuum pump to the gas distributors and slowly drawing the cleaning gas within the vacuum chamber in a reverse flow direction from the chamber, through the gas distributors and from the system through the vacuum pump.

A primary advantage of the invention is that by independently supplying process gases to the second (or upper) gas distributor, a more uniform deposition thickness can be achieved under a variety of operating conditions, which result in a change in the distribution of the process gases through the first or lower gas distributors.

It has been found that a second gas distributor with a single exit is effective for use with 8-inch (20 cm) substrates. However, for larger substrates, such as 12-inch (30 cm) substrates, one or more second gas distributors having a plurality of exits will likely provide the best deposition thickness uniformity.

Other features and advantages of the invention will appear from the following description in which the preferred embodiment has been set forth in detail in conjunction with the accompanying drawings.

BRIEF DESCRIPTION OF THE DRAWINGS

FIG. 1 is a schematic cross-sectional view showing a deposition chamber made according to the invention;

FIG. 1A is a simplified view of an alternative embodiment of the center nozzle of FIG. 1 having three orifices finding particular utility for use with larger diameter (e.g., 12-inch or 30 cm) substrates;

FIG. 2 is an exaggerated view illustrating the characteristic M-shaped, deposition thickness variation plot of the prior art;

FIG. 3 illustrates an improvement in the deposition thickness variation plot of FIG. 2 using the apparatus and method according to the invention;

FIG. 4 is a schematic diagram illustrating a pair of equal length gas feed lines used to supply the manifold with the process gases at equal pressures; and FIG. 5 is a schematic diagram illustrating how a cleaning gas within the chamber can be drawn back through the nozzles using a vacuum pump.

DESCRIPTION OF THE PREFERRED EMBODIMENT

FIG. 1 illustrates a deposition chamber 2 comprising a housing 4, the housing including a dielectric dome 6 surrounded by RF inductive coils 8. Coils 8 are powered by a source RF generator 10 through a matching circuit 12. Chamber 2 also includes a substrate support 14 having a substrate support surface 16 within the vacuum chamber 18 defined within housing 4. Surface 16 is used to support a substrate 20 within chamber 18. Substrate support 14 acts as a cathode and is connected to a bias RF generator 22 through a matching circuit 24. The top 25 of housing 4 acts as an anode and is electrically biased by a second bias RF generator 26 through a matching circuit 28. A generally cylindrical sidewall 30 of housing 4 connects the bottom 32 of housing 4 to dielectric dome 6. Process gases, typically including deposition gases such as silane, TEOS, silicon tetrafluoride ($SiF_4$) and any other reactive deposition gas which has a short lifetime in chamber 18, as well as process gases such as argon, are introduced to vacuum chamber 18 through a series of 12 equally spaced nozzles 34. As suggested in FIG. 4, nozzles 34 are arranged in a ring-like pattern and are all fluidly coupled to a gas manifold 36. Each nozzle 34 has an orifice 38 at its distal end. The orifices 38 of nozzles 34 are arranged above the periphery 40 of substrate support 14 and thus above the periphery 42 of substrate 20 since the two peripheries are generally aligned. Vacuum chamber 18 is exhausted through an exhaust port 44.

The above-described structure of deposition chamber 2 is described in more detail in U.S. patent application Ser. No. 08/234,746 filed Apr. 26, 1994, the disclosure of which is incorporated by reference.

FIG. 2 illustrates a typical deposition thickness variation plot 46 for a conventional deposition chamber as described above. The average thickness is shown by base line 48. As can be seen by this plot 46, there is a relatively steep increase in thickness at end points 50 and 52 of plot 46 corresponding to the periphery 42 of substrate 20. The center 54 of plot 46 also dips down substantially as well.

The present invention improves upon plot 46 through the use of a center nozzle 56 coupled to a second gas source 58 through a second gas controller 60 and a second gas feed line 62. See FIGS. 1 and 4. Center nozzle 56 has an orifice 64 positioned centrally above substrate support surface 16. Orifice 64 is positioned at least twice the distance from surface 16 as are orifices 38 of nozzles 34. Using center nozzle 56 permits the modification of deposition thickness variation plot 46 from that of FIG. 2 to exemplary plot 68 of FIG. 3. Exemplary deposition thickness variation plot 68 is flat enough so that the standard deviation of the deposition thickness is about 1 to 2% of one sigma. This is achieved primarily by reducing the steep slope of the plot at end points 50, 52 and raising in the low point at center 54 of plot 46.

In the preferred embodiment, 12 identical nozzles 34 are used in the regions surrounding periphery 40 of substrate support 14. Orifices 38 have a diameter of about 0.014 inch (0.36 mm) and a depth or throat of about 0.020 inch (0.51 mm). It has been found that enlarging the orifice diameter and limiting the depth or throat of orifice 38 is important in ensuring that cleaning gases defuse back into the nozzles during dry clean operations. Such consideration may not be as necessary when the nozzle cleaning system described with reference to FIG. 5 is used.

To help ensure that equal amounts of processing gases pass through each orifice 38, it is useful to provide the processing gases at the same pressure to each nozzle 34. To help do so, the processing gas is provided to manifold 36 at opposite sides of the manifold as shown in FIG. 4. Manifold 36 is supplied by a pair of gas feed lines 70, 72, which are coupled to a first gas controller 74 and a first gas source 76 as shown in FIG. 4. Gas feed line 70, 72 are constructed so as to be of equal lengths and equal diameters to provide equal resistance to fluid flow for the processing gases entering manifold 36. Other ways for helping to ensure the same amount of processing gas flows through nozzles 34 could be used. For example, manifold 36 could be modified so that it is actually two manifolds, an outer manifold (not shown) coupled to one or more of the gas feed lines 70, 72 and having openings (not shown) opening into a inner manifold (not shown) to which first nozzles 34 are mounted. The openings coupling the outer and inner manifolds could be smaller adjacent the entrances of gas feed lines 70, 72 and larger away from those entrances to help equalize the flow rates to first nozzles 34.

While deposition chamber 2 is suitable for dry cleaning operations, the system shown with reference to FIG. 5 can be used to help ensure proper cleaning of the nozzles. A process gas valve 78 is used along common gas feed line 80 operates as a final valve so to isolate vacuum chamber 18 from first gas controller 74 during cleaning operations. Downstream of process gas valve 78, that is between the process gas valve 78 and manifold 36, is a cleaning gas line 82 coupling a vacuum pump 84 to common gas feed line 80 through a flow control valve 86 and a shutoff valve 88, valves 86, 88 acting as a flow control assembly 90. For cleaning nozzles 34, valve 78 is closed, a cleaning gas is introduced into vacuum chamber 18, shutoff valve 88 is opened and flow control valve 86 is operated to permit vacuum pump 84 to slowly draw the cleaning gas into nozzles 34 through orifices 38, back through manifold 36 and along line 82 through the operation of vacuum pump 84. In this way, cleaning of the insides of nozzles 34 is not left to the ability of the cleaning gases to diffuse into the interior of the nozzles through their orifices 38 but rather are actively, albeit slowly, drawn through the orifices and into the nozzles by vacuum pump 84.

In use, the operator can affect or control the deposition thickness uniformity occurring on substrate 20 by controlling the discharge of process gases through center nozzle 56 independently of the passage of the same or different process gases through nozzles 34. Thickness uniformly is also enhanced by helping to equalize the flow through each orifice 38 into vacuum chamber 18, preferably by delivering the gases to the manifold 36 using two or more gas feed lines 70, 72, each gas feed line exhibiting a common fluid flow resistance from a common gas source 76. After a period of time, it may be desired to clean deposition chamber 2 using various cleaning gases within vacuum chamber 18. Orifices 38 and the remainders of the interiors of nozzles 34 can be effectively cleaned by using vacuum pump 84, typically a roughing pump, to slowly draw the cleaning gases in a retrograde or reverse manner through orifices 38 and into the interiors of nozzles 34, into manifold 36 and finally from chamber 2.

In the preferred embodiment maximum flexibility is achieved using two gas controllers 60, 74 and two separate gas sources 58, 76 since this permits both the composition and rate of gas flow through nozzles 34, 56 to be independently varied. If the same gas composition is to be used for nozzles 34, 56, a single gas source, a single gas controller and a flow divider could be used to supply the gas to lines 62, 80.

The above-described embodiment has been designed for substrates 20 having diameters of 8 inches (20 cm). Larger diameter substrates, such as substrates having diameters of 12 inches (30 cm), may call for the use of multiple center nozzles 56a as illustrated in FIG. 1A. In such embodiments the deposition thickness variation plot would likely have a three-bump (as in FIG. 3), a four-bump or a five-bump shape. The particular shape for the deposition thickness plot would be influenced by the type, number, orientation and spacing of center nozzles 56A and orifices 64.

Modification and variation can be made to the disclosed embodiment without departing from the subject of the invention as defined in the following claims. For example, center nozzle 56 could be replaced by a shower head type of gas distributor having multiple exits. Similarly, nozzles 34 or nozzles 56a could be replaced by, for example, a ring or ring-like structure having gas exits or orifices through which the process gases are delivered into chamber 18.

What is claimed is:

1. A deposition chamber comprising:
    a housing defining a single vacuum chamber;
    a substrate support having a substrate support surface within the vacuum chamber, the substrate support surface having a central region and a periphery;
    a plurality of first gas distributors having first exits opening into the vacuum chamber, the first exits directed generally towards the central region;
    a second gas distributor having a second exit spaced apart from and generally overlying said substrate support surface, said second exit opening directly into the vacuum chamber; and
    said first gas distributors being located closer to the support surface than are the second gas distributors.

2. The chamber according to claim 1 further comprising inductive coils mounted to the housing and coupled to a radio frequency generator.

3. The chamber according to claim 1 wherein the periphery is generally circular.

4. The chamber according to claim 1 wherein the first gas distributors include a plurality of nozzles equally spaced about the center of the substrate support surface.

5. The chamber according to claim 1 wherein the second gas distributor includes a second nozzle and said second exit includes a single orifice.

6. The chamber according to claim 1 wherein the second gas distributor includes a plurality of second nozzles and said second exit includes a plurality of orifices.

7. The chamber according to claim 1 wherein the second gas distributor is spaced apart from the support surface by a distance at least twice as great as a distance between the support surface and any one of the first gas distributors.

8. The chamber according to claim 1 further comprising a gas manifold fluidly coupled to the first gas distributors.

9. The chamber according to claim 8 further comprising means for helping to supply gas to the first gas distributors at substantially the same pressure.

10. The chamber according to claim 9 wherein the helping means comprises a plurality of equal diameter, equal length gas supply lines fluidly coupled to the manifold at different positions along the manifold.

11. The chamber according to claim 9 wherein the helping means comprises a plurality of gas supply lines fluidly coupled to the manifold at different positions along the manifold, each gas supply line constructed to provide equal resistance to fluid flow.

12. The chamber according to claim 1 further comprising:
    a vacuum pump having an inlet and an outlet;
    a passageway fluidly coupling the inlet to at least one of the first and second gas distributors; and
    a flow control assembly controlling fluid flow along the passageway so that a cleaning gas within the vacuum chamber can be drawn from the vacuum chamber and through the at least one of the first and second gas distributors in a controlled manner so to ensure effective cleaning of the distributors.

13. The chamber according to claim 12 wherein the vacuum pump is a roughing pump.

14. The chamber according to claim 12 wherein the flow control assembly comprises a shutoff valve along the passageway and a flow controller along the passageway between the shutoff valve and the vacuum pump.

* * * * *